United States Patent
Kobayashi et al.

(10) Patent No.: US 7,325,459 B2
(45) Date of Patent: Feb. 5, 2008

(54) IDENTIFYING UNIT FOR WORKING MACHINE AND PRESSURE APPARATUS

(75) Inventors: Taizan Kobayashi, Kawasaki (JP); Eiji Takada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 29 days.

(21) Appl. No.: 11/139,805

(22) Filed: May 31, 2005

(65) Prior Publication Data

US 2006/0169050 A1    Aug. 3, 2006

(30) Foreign Application Priority Data

Jan. 31, 2005    (JP)   ............................. 2005-023495

(51) Int. Cl.
     *G01L 1/00*      (2006.01)
     *B23Q 23/00*      (2006.01)

(52) U.S. Cl. ........................................... 73/760; 483/7

(58) Field of Classification Search .................. 73/760; 483/7, 8, 9

See application file for complete search history.

(56) References Cited

U.S. PATENT DOCUMENTS

| | | | | |
|---|---|---|---|---|
| 4,601,637 A | * | 7/1986 | Aviles et al. | ............... 414/739 |
| 4,611,397 A | * | 9/1986 | Janisiewicz et al. | .......... 29/834 |
| 4,633,720 A | * | 1/1987 | Dybel et al. | ............. 73/862.53 |
| 4,964,211 A | * | 10/1990 | Arao et al. | ..................... 29/705 |
| 5,355,129 A | * | 10/1994 | Baumann | ............... 340/870.04 |
| 5,514,063 A | * | 5/1996 | Stoll et al. | ..................... 483/66 |
| 5,772,564 A | * | 6/1998 | Taniguchi et al. | ............. 483/7 |
| 5,872,316 A | * | 2/1999 | Duggirala et al. | ............ 73/768 |
| 5,924,192 A | * | 7/1999 | Wuyts | ......................... 29/833 |
| 6,098,275 A | * | 8/2000 | Wuyts et al. | ................. 29/741 |
| 6,178,621 B1 | * | 1/2001 | Shida et al. | .................. 29/740 |
| 6,344,018 B1 | * | 2/2002 | Aizawa | ...................... 483/29 |
| 6,350,222 B2 | * | 2/2002 | Susnjara | ........................ 483/1 |
| 6,501,211 B1 | * | 12/2002 | Nasrollahzadeh | ........... 310/338 |
| 2004/0173009 A1 | * | 9/2004 | Doe et al. | ................... 73/54.02 |
| 2005/0071991 A1 | * | 4/2005 | Yonezawa et al. | ............. 29/740 |
| 2006/0112541 A1 | * | 6/2006 | Kobayashi et al. | ........... 29/740 |

FOREIGN PATENT DOCUMENTS

| | | |
|---|---|---|
| JP | 2877120 | 1/1999 |
| JP | 2004-55705 | 2/2004 |

* cited by examiner

*Primary Examiner*—Michael Cygan
*Assistant Examiner*—Punam Patel
(74) *Attorney, Agent, or Firm*—Westerman, Hattori, Daniels & Adrian, LLP.

(57) ABSTRACT

A working machines includes an identifying unit. A force sensor detachably supports a working head in the identifying unit. A controller circuit is designed to identify the working head based on the load detected at the force sensor. When the working head is replaced with another one, the load changes in the force sensor in the identifying unit. In general, the individual working head has the specific weight. The working heads can thus be differentiated from each other based on the weight. Accordingly, the controller circuit is allowed to reliably identify the working head after the replacement with a higher accuracy based on the detected load.

7 Claims, 3 Drawing Sheets

IDENTIFYING UNIT FOR WORKING MACHINE AND PRESSURE APPARATUS

BACKGROUND OF THE INVENTION

1. Field of the Invention

The present invention relates to a working machine such as a chip mounter designed to mount an electronic circuit chip onto a printed wiring board. In particular, the invention relates to an identifying unit and a pressure apparatus utilized in the working machine.

2. Description of the Prior Art

A chip mounter is well known as disclosed in Japanese Patent Application Publication No. 2004-55705, for example. The chip mounter includes a working head opposed to the surface of a work stage. A movable member is designed to move toward and away from the surface of the work stage in the chip mounter. The movable member is supported on a guide for relative movement. A load cell is fixed to the movable member. The working head is detachably coupled to the load cell. When the working head is urged against a printed circuit board on the work stage, the applied load is measured at the load cell.

Various working heads are prepared for the chip mounter depending on the purposes. Control parameters may be selected for the individual working heads in the chip mounter. The control parameters are employed in controlling the position of the movable member and the thrust of the movable member. Bar codes are heretofore employed to identify the working head in setting the control parameters, for example. When the bar code is erroneously detected in the chip mounter, the control parameters cannot correctly be set for the working head on the movable member in the chip mounter.

SUMMARY OF THE INVENTION

It is accordingly an object of the present invention to provide an identifying unit and a working machine reliably contributing to an accurate identification of a working head. It is an object of the present invention to provide a pressure apparatus contributing to realization of the working machine.

According to a first aspect of the present invention, there is provided an identifying unit for a working machine, comprising: a force sensor detachably supporting a working head; and a controller circuit designed to identify the working head based on load detected at the force sensor.

When the working head is replaced with another one, for example, the load changes in the force sensor in the identifying unit. In general, the individual working head has the specific weight. The working heads can thus be differentiated from each other based on the weight. Accordingly, the controller circuit is allowed to reliably identify the working head after the replacement with a higher accuracy based on the detected load.

According to a second aspect of the present invention, there is provided a pressure apparatus comprising: a movable member; a force sensor coupled to the movable member; a contact member detachably connected to the force sensor; a drive source connected to the movable member for generating a driving force to drive the movable member; and a controller circuit connected to the force sensor and the drive source so as to control the drive source based on load detected at the force sensor, said controller circuit designed to identify the contact member based on the load detected at the force sensor.

When the contact member is replaced with another one, for example, the load changes in the force sensor in the pressure apparatus in the same manner as described above. In general, the individual contact member has the specific weight. The contact members can thus be differentiated from each other based on the weight. Accordingly, the controller circuit is allowed to reliably identify the contact member after the replacement with a higher accuracy based on the detected load.

In addition, the force sensor is utilized to identify the contact member. The force sensor is often originally employed in the pressure apparatus. It is not necessary to add a component such as a sensor peculiar to the identification of the contact member into the pressure apparatus. The invention can be applied to a conventional pressure apparatus without any difficulty.

The controller circuit may set a control parameter of the contact member based on the identification of the contact member. Automatic setting of the control parameter in response to the identification of the contact member enables reduction in troublesome operations in replacement of the contact members. Since the contact member can be identified with a higher accuracy as described above, an erroneous setting of the control parameter can reliably be avoided in the pressure apparatus.

According to a third aspect of the present invention, there is provided a working machine comprising: a work table defining the surface along a horizontal plane; a working head opposed to the surface of the work table; a force sensor detachably supporting the working head; a movable member coupled to the force sensor; a drive source connected to the movable member for generating a driving force to drive the movable member; and a controller circuit connected to the force sensor and the drive source so as to control the drive source based on load detected at the force sensor, said controller circuit designed to identify the contact member based on the load detected at the force sensor.

When the working head is replaced with another one, for example, the load changes in the force sensor in the working machine in the same manner as described above. In general, the individual working head has the specific weight. The working heads can thus be differentiated from each other based on the weight. Accordingly, the controller circuit is allowed to reliably identify the working head after the replacement with a higher accuracy based on the detected load. In addition, the force sensor is utilized to identify the working head. The force sensor is often originally employed to effect processing such as a pressing operation in the working machine. It is not necessary to add a component such as a sensor peculiar to the identification of the contact member into the working machine. The invention can be applied to a conventional working machine without any difficulty.

The controller circuit may set a control parameter of the working head based on the identification of the working head. Automatic setting of the control parameter in response to the identification of the working head enables reduction in troublesome operations in replacement of the working heads. Since the working head can be identified with a higher accuracy as described above, an erroneous setting of the control parameter can reliably be avoided in the working machine.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
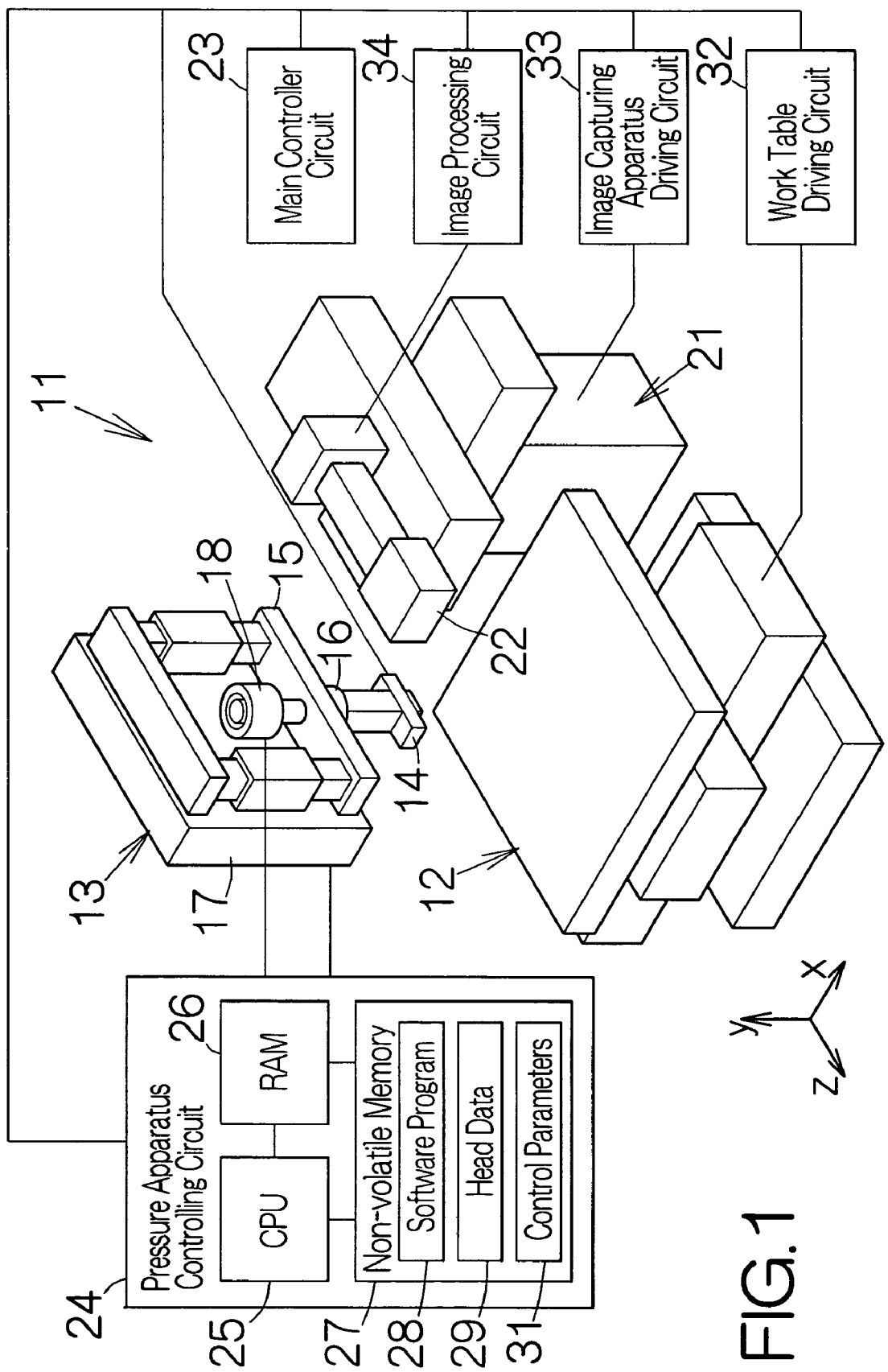
FIG. 1 is a perspective view schematically illustrating the structure of a chip mounter according to a specific example of the present invention.

FIG. 1 schematically illustrates the structure of a chip mounter 11 as a specific example of a working machine according to the present invention. The chip mounter 11 includes a work table 12 defining a top surface along a horizontal plane. The work table 12 is allowed to move in a horizontal direction. A printed circuit board or printed wiring board may be mounted on the top surface of the work table 12.

Here, a three dimensional coordinate system or xyz-coordinate system is set in the chip mounter 11. The xyz-coordinate system includes the y-axis perpendicular to the top surface of the work table 12, namely the horizontal plane. The work table 12 can be moved in the x-axis and the y-axis. The position of the work table 12 can be determined based on the x-axis and y-axis of the xyz-coordinate system.

A pressure apparatus 13 is related to the work table 12. The pressure apparatus 13 includes an ultrasonic head 14 as an example of a contact member or a working head according to the present invention. The ultrasonic head 14 is designed to support an electronic circuit chip at the tip end. An ultrasonic oscillator is installed within the ultrasonic head 14 so as to generate an ultrasonic vibration of the ultrasonic head 14. The ultrasonic oscillator transmits the ultrasonic wave to the electronic circuit chip. The ultrasonic wave serves to vibrate the ultrasonic head 14 in parallel with the horizontal plane.

The ultrasonic head 14 is designed to move in the perpendicular direction perpendicular to the top surface of the work table 12 as described later in detail. The perpendicular movement of the ultrasonic head 14 serves to urge the electronic circuit chip against the printed circuit board held on the top surface of the work table 12. The ultrasonic vibration is in this manner transmitted to the electronic circuit chip. Ultrasonic bonding can be achieved based on the action of the ultrasonic head 14.

The pressure apparatus 13 includes a movable member 15 coupled to the ultrasonic head 14. A force sensor 16 is interposed between the ultrasonic head 14 and the movable member 15. The force sensor 16 detachably holds the ultrasonic head 14. The force sensor 16 is designed to detect the force or load applied to the ultrasonic head 14 along the y-axis in the perpendicular direction. The force sensor 16 converts the detected load to an electric signal. The force sensor 16 will be described later in detail.

The pressure apparatus 13 further includes a support member 17. The support member 17 supports the movable member 15. The support member 17 stands stationary during the movement of the movable member 15. Specifically, the ultrasonic head 14, the moveable member 15 and the force sensor 16 are allowed to move relative to the support member 17. A drive source such as a voice coil motor (VCM) 18 is coupled to the movable member 15. The voice coil motor 18 serves to generate a driving force to drive the movable member 15. The voice coil motor 18 induces a perpendicular movement of the ultrasonic head 14 and the force sensor 16.

An image capturing apparatus 21 is related to the work table 12 and the pressure apparatus 13. The image capturing apparatus 21 is allowed to move in the horizontal direction along the z-axis in parallel with the top surface of the work table 12. The image capturing apparatus 21 includes a camera unit 22 designed to capture images. When the image capturing apparatus 21 moves in the horizontal direction in a specific manner, the camera unit 22 is positioned in a space between the ultrasonic head 14 and the top surface of the work table 12. The camera unit 22 is in this manner capable of simultaneously capture the images of the electronic circuit chip held on the ultrasonic head 14 and the printed circuit board placed on the top surface of the work table 12.

The chip mounter 11 includes a main controller circuit 23. The main controller circuit 23 is designed to control the operation of the chip mounter 11 in accordance with a predetermined processing program. The main controller circuit 23 supplies a predetermined electric signal to the ultrasonic oscillator installed within the ultrasonic head 14. Ultrasonic vibration is induced in the ultrasonic head 14 based on the supplied electric signal.

A pressure apparatus controlling circuit 24 is connected to the main controller circuit 23. The pressure apparatus controlling circuit 24 includes a central processing unit (CPU) 25. A random access memory (RAM) 26 and a non-volatile memory 27 are connected to the CPU 25. A flash memory may be employed as the non-volatile memory 27, for example. A software program 28 is stored in the non-volatile memory 27. The CPU 25 executes the processings in accordance with the software program temporarily held within the random access memory 26.

Here, the CPU 25 is designed to supply the voice coil motor 18 with electric current. The CPU 25 implements the software program 28 to supply the electric current. The perpendicular movement of the movable member 15 is induced based on the supplied current. The ultrasonic head 14 is in this manner moved along the y-axis in the perpendicular direction perpendicular to the top surface of the work table 12. The CPU 25 controls the thrust applied to the ultrasonic head 14 as described later in detail. The force sensor 16 and the pressure apparatus controlling circuit 24 serves as an identifying unit according to the present invention.

A head data 29 is stored in the non-volatile memory 27. The head data 29 is utilized to identify individual ultrasonic heads 14. Here, the head data 29 includes a weight data specifying the weight of various working heads including the ultrasonic heads 14. The CPU 25 obtains the load based on the electric signal supplied from the force sensor 16. The CPU 25 is allowed to determine the weight of the ultrasonic head 14 based on the detected load. The CPU 25 thus identifies a specific ultrasonic head 14 based on the comparison between the head data 29 and the detected weight.

Control parameters 31 for the ultrasonic heads 14 are further stored in the non-volatile memory 27. The control parameters 31 are uniquely set for the various working heads including the individual ultrasonic heads 14. The control parameters 31 may include PID control gains, coefficients of filter, limits or thresholds for various numerical data, and the like. The PID control gains may be employed to control the position and thrust of the ultrasonic head 14. The coefficients of filter may be employed to suppress an excessive vibration of the ultrasonic head 14. The limits define the upper limit of the current value for current supplied to the ultrasonic head 14, the upper limit for the load applied to the force sensor 16, and the like.

A work table driving circuit 32 is connected to the main controller circuit 23. The work table driving circuit 32 is designed to supply a predetermined electric signal to an electric motor incorporated within the work table 12, for example. The work table driving circuit 32 may receive a predetermined control signal from the main controller circuit 23 in supplying the electric signal to the work table 12. The work table 12 is allowed to move in the horizontal direction along the x-axis and z-axis based on the supplied electric signal.

An image capturing apparatus driving circuit 33 is also connected to the main controller circuit 23. The image capturing apparatus driving circuit 33 is designed to supply a predetermined electric signal to an electric motor incorporated within the image capturing apparatus 21, for example. The image capturing apparatus driving circuit 33 may receive a predetermined control signal from the main controller circuit 23 in supplying the electric signal to the image capturing apparatus 21. The image capturing apparatus 21 is allowed to move in the horizontal direction along the z-axis based on the supplied electric signal.

An image processing circuit 34 is also connected to the main controller circuit 23. The image processing circuit 34 is designed to supply a predetermined control signal to the camera unit 22. The camera unit 22 is allowed to capture an image of the printed circuit board in response to the supply of the control signal. The image processing circuit 34 processes and analyzes the image output from the camera unit 22. The image processing circuit 34 may receive a predetermined control signal from the main controller circuit 23 in supplying the control signal to the camera unit 22.

Figure 2:
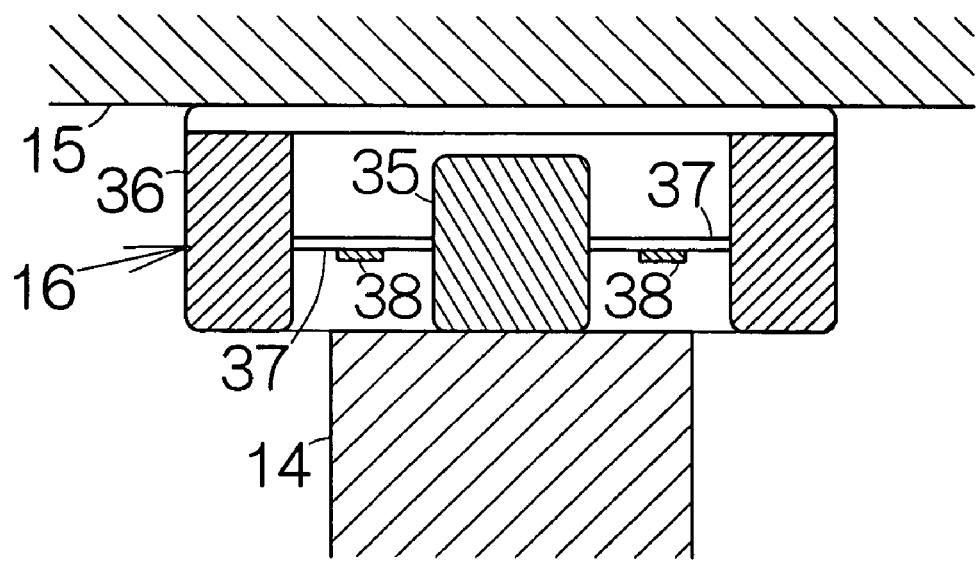
FIG. 2 is a sectional view schematically illustrating the structure of a force sensor in the chip mounter.

As shown in FIG. 2, the force sensor 16 includes a central axle 35 and an annular member 36 surrounding the central axle 35. Connecting pieces 37 connect the central axle 35 to the annular member 36. The connecting pieces 37 radiate from the central axle 35 in four directions, for example. A strain gauge 38 is attached on the individual connecting piece 37.

The lower end of the central axle 35 is coupled to the upper end of the ultrasonic head 14. The ultrasonic head 14 is detachably coupled to the central axle 35. The annular member 36 is coupled to the lower end of the movable member 15. A predetermined gap is defined between the upper end of the central axle 35 and the lower end of the movable member 15. The connecting pieces 37 in this manner serve to connect the ultrasonic head 14 and the movable member 15 to each other.

Electric current is supplied to the strain gauges 38. When the movable member 15 serves to urge the ultrasonic head 14 against a printed circuit board placed on the top surface of the work table 12, for example, the ultrasonic head 14 lifts up the central axle 35 along the y-axis toward the movable member 15. The central axle 35 thus receives a load. The central axle 35 moves upward relative to the annular member 37. Strain is induced in the connecting pieces 37. Electric resistance is correspondingly changed in the strain gauges 37. This change in the electric resistance is converted into electric signals. The obtained electric signals are supplied from the force sensor 16 to the CPU 25 in the pressure apparatus controlling circuit 24.

On the other hand, when the central axle 35 receives the weight of the ultrasonic head 14, the central axle 35 falls in the y-axis toward the work table 12. The central axle 35 moves downward relative to the annular member 36. Strain is induced in the connecting pieces 37. Electric resistance is correspondingly changed in the strain gauges 37. This change in the electric resistance is converted into electric signals. The obtained electric signals are supplied from the force sensor 16 to the CPU 25 in the pressure apparatus controlling circuit 24. Compression load and tensile load are thus detected at the force sensor 16.

Now, assume that an electronic circuit chip is to be mounted on a printed circuit board. The printed circuit board is placed on the top surface of the work table 12. The chip is held on the ultrasonic head 14. Ball bumps are arranged on the lower surface of the chip. The ball bumps may be made of an electrically conductive material such as copper, for example. A position mark is printed on the lower surface of the chip. A position mark is likewise printed on the upper surface of the printed circuit board so as to identify the position of the chip. The ultrasonic head 14 is first positioned at a predetermined first position. The ultrasonic head 14 at the first position is spaced from the work table 12 at a distance.

The main controller circuit 23 then supplies the image capturing apparatus driving circuit 33 with a control signal. An electric signal is supplied to the image capturing apparatus 21 from the image capturing apparatus driving circuit 33 based on the control signal. The image capturing apparatus 21 is thus moved in the horizontal direction to a predetermined position in the z-axis toward the work table 12. The camera unit 22 is positioned in a space between the ultrasonic head 14 and the work table 12. The main controller circuit 23 then supplies the image processing circuit 34 with a predetermined control signal. The image processing circuit 35 outputs a control signal to the camera unit 22. The supply of the control signal causes the camera unit 22 to simultaneously photograph the chip and the printed circuit board. The pictures or captured images are supplied to the image processing circuit 34.

The image processing circuit 34 detects the position marks on the chip and the printed circuit board based on the captured images. The detected position is converted into a position signal. The position signal is supplied to the main controller circuit 23. The main controller circuit 23 calculates the amount of displacement between the position marks on the chip and the printed circuit board based on the position signal. The main controller circuit 23 then calculates the adjustment amount for the work table 12 based on the amount of displacement. The main controller circuit 23 may implement a predetermined software program so as to execute the calculations.

The main controller circuit 23 supplies the work table driving circuit 33 with a control signal derived from the adjustment amount. An electric signal is thus supplied to the work table 12 from the work table driving circuit 33. The work table 12 is allowed to move in the horizontal direction to a predetermined position. The position mark on the printed circuit board is in this manner aligned with the position mark on the chip. The chip is positioned at the target position relative to the printed circuit board. The image capturing apparatus 21 is thereafter withdrawn from the space between the ultrasonic head 14 and the work table 12.

The main controller circuit 23 then supplies the pressure apparatus controlling circuit 24 with a control signal. The supply of the control signal causes the CPU 25 of the pressure apparatus controlling circuit 24 to implement the software program 28. The CPU 25 supplies the voice coil motor 18 with electric current in accordance with the control parameters 31. Here, the CPU 25 may retrieve the control parameters 31 corresponding to the ultrasonic head 14 for a temporary storage in the random access memory 26. The perpendicular movement of the ultrasonic head 14 is controlled based on the control parameters 31. The ultrasonic head 14 moves downward toward the work table 12. The ultrasonic head 14 is thus positioned at a predetermined second position. The chip is spaced from the printed circuit board at a distance when the ultrasonic head 14 takes the second position.

When the ultrasonic head 14 further moves downward from the second position, the ultrasonic head 14 urges the chip against the printed circuit board. The ball bumps on the chip are forced to contact with corresponding electrically conductive pads on the printed circuit board. The electrically conductive pads may be made of an electrically conductive material such as copper, for example.

When the chip is urged against the printed circuit board, the ultrasonic head 14 lifts up the central axle 35 in the force sensor 16 along the y-axis. The central axle 35 moves upward relative to the annular member 36. Strain is induced in the connecting pieces 37. The strain gauges 38 get deformed, so that the electric resistance is changed. The change in the electric resistance is converted into an electric signal. The electric signal is then supplied to the CPU 25 from the force sensor 16. The CPU 25 detects the load based on the electric signal. The CPU 25 operates to supply electric current to the voice coil motor 18 in accordance with the control parameters 31 based on the detected load. This causes the perpendicular movement of the ultrasonic head 14. The load or thrust of the ultrasonic head 14 may be determined based on the physical property of the chip and printed circuit board.

The main controller circuit 23 supplies the ultrasonic head 14 with an electric signal. The supply of the electric signal causes the ultrasonic oscillator to generate an ultrasonic vibration. The ultrasonic vibration is transmitted to the ultrasonic head 14 in the horizontal direction. The ultrasonic vibration of the ball bumps is thus induced. Plastic deformation is induced at contacts between the ball bumps and the electrically conductive pads based on the ultrasonic energy. Oxide films are broken at the contacts between the ball bumps and the electrically conductive pads. Exchanged metallic atoms diffuse into the ball bumps and the electrically conductive pads. The ball bumps are in this manner bonded to the corresponding electrically conductive pads. A so-called ultrasonic bonding is achieved.

The CPU 25 thereafter supplies electric current to the voice coil motor 18 in accordance with the control parameters 31. The ultrasonic head 14 thus moves upward. The ultrasonic head 14 is allowed to reach the first position through the second position. The printed circuit board is displaced from the work table 12 along with the chip. A printed circuit board and a chip are thereafter set on the work table 12 and the ultrasonic head 14 again. The chip mounter repeats the aforementioned processes. These processes are executed in three seconds, for example, after the set of the printed circuit board and chip to the accomplishment of the ultrasonic bonding.

Figure 3:
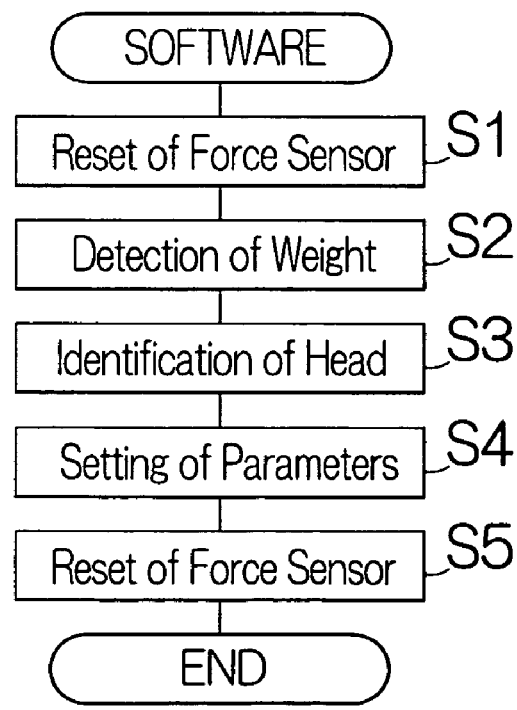
FIG. 3 is a flowchart illustrating processings according to execution of a software program in replacement of ultrasonic heads in the chip mounter.
Figure 4:
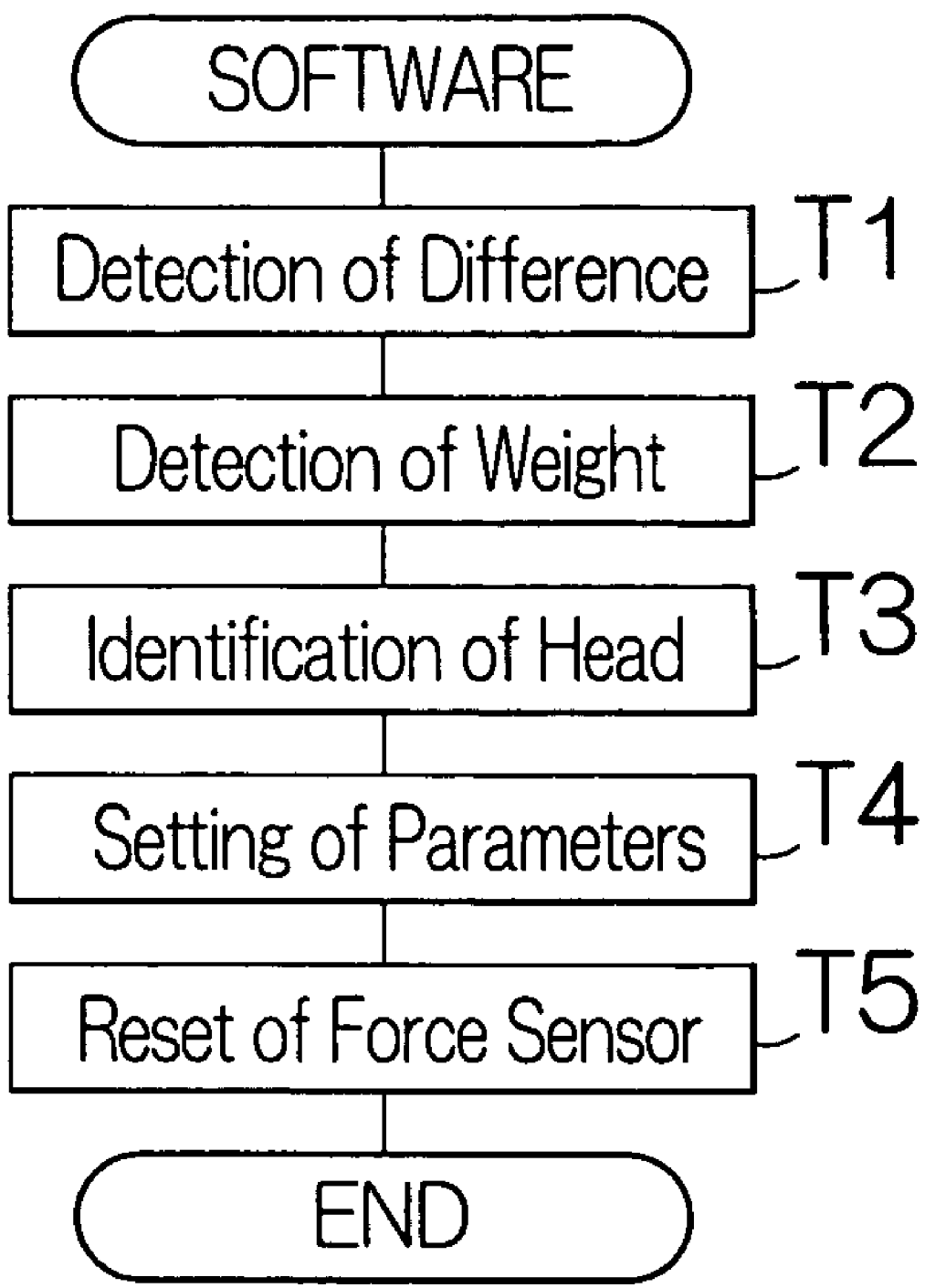
FIG. 4 is a flowchart illustrating processings according to execution of a software program in replacement of ultrasonic heads in the chip mounter.

Assume that the ultrasonic head 14 is replaced with another. The CPU 25 of the pressure apparatus controlling circuit 24 implements the software program 28. First of all, the ultrasonic head 14 is detached from the force sensor 16. The central axle 35 is released from the weight of the ultrasonic head 14 in the force sensor 16. Deformation is accordingly induced in the strain gauges 38. The resistance value subjected to a change in response to the deformation is converted into an electric signal. The electric signal is supplied to the CPU 25 from the force sensor 16. As shown in FIG. 3, the CPU 25 sets the value "0" for the load of the force sensor 16 at step S1. The load is thus reset in the force sensor 16.

Another ultrasonic head 14 is then attached to the force sensor 16. The weight of this ultrasonic head 14 acts on the central axle 35 of the force sensor 16. The central axle 35 moves downward toward the work table 12 along the y-axis. Deformation is induced in the strain gauges 38. The resistance value subjected to a change in response to the deformation is converted into an electric signal. The electric signal is then supplied to the CPU 25 from the force sensor 16.

The CPU 25 detects at step S2 the load based on the received electric signal. In this case, the load corresponds to the weight of the ultrasonic head 14 after the replacement, since the load acts on the force sensor 16 solely based on the weight of the attached ultrasonic head 14. The CPU 25 operates to refer to the head data 29 in the non-volatile memory 27. The CPU 25 searches for the head data corresponding to the detected load. The CPU 25 in this manner operates to identify the attached ultrasonic head 14 after the replacement at step S3.

The CPU 25 selects at step S4 the control parameters 31 related to the ultrasonic head 14 after the replacement. The selected control parameters 31 are set in the non-volatile memory 27. The CPU 25 then sets the value "0" for the load of the force sensor 16 at step S5. The load is thus reset in the force sensor 16. The load or thrust of the ultrasonic head 14 after the replacement can thus be detected with a higher accuracy. The chip mounter 11 thereafter returns to the normal operation. The CPU 25 may temporarily store the retrieved control parameters 31 into the random access memory 26 during the normal operation.

When the ultrasonic heads 14 are replaced in the chip mounter 11, the load changes in the force sensor 16. The load or weight can be related to the individual ultrasonic heads 14, for example, so that the CPU 25 is allowed to identify the ultrasonic head 14 after replacement with a higher accuracy based on the detected load.

Moreover, the force sensor 16 is utilized to realize the identification of the ultrasonic head 14. The force sensor 16 is originally employed in the chip mounter 11 in mounting an electronic circuit chip onto a printed circuit board. It is not necessary to add a component such as a sensor peculiar to the identification of the ultrasonic head 14 into the chip mounter 11. The invention can be applied to a conventional chip mounter in a facilitated manner.

Furthermore, the control parameters 31 are automatically set in the chip mounter 11 in response to the identification of the ultrasonic head 14. The operator is thus released from a troublesome operation in replacement of the ultrasonic heads 14. Since the ultrasonic head 14 can be identified with a higher accuracy as described above, an erroneous setting of the control parameters 31 can reliably be avoided in the chip mounter 11.

Otherwise, the reset of the load can be omitted from the aforementioned processings in the replacement of the ultrasonic heads 14. In this case, the CPU 25 detects the weight of the ultrasonic head 14 before the replacement based on the force sensor 16. The ultrasonic head 14 is subsequently detached from the force sensor 16. Another ultrasonic head 14 is attached to the force sensor 16. The weight of the ultrasonic head 14 acts on the central axle 35 of the force sensor 16. The central axle 35 moves downward toward the work table 12 along the y-axis. Deformation is induced in the strain gauges 38. The resistance value subjected to a change in response to the deformation is converted into an electric signal. The electric signal is supplied to the CPU 25 from the force sensor 16.

The CPU 25 operates to detect the load based on the received electric signal. The CPU 25 calculates the difference between the detected load and the weight of the ultrasonic head 14 before the replacement at step T1. The CPU 25 subsequently calculates the weight of the ultrasonic head 14 after the replacement based on the derived difference at step T2. The CPU 25 then operates to refer to the head data 29 stored in the non-volatile memory 27. The CPU 25 searches for the head data 29 corresponding to the detected load. The CPU 25 in this manner identifies the ultrasonic head 14 at step T3.

The CPU 25 selects at step T4 the control parameters 31 related to the new ultrasonic head 14. The selected control parameters 31 are set in the non-volatile memory 27. The CPU 25 then sets the value "0" for the load of the force sensor 16 at step T5. The load is reset in the force sensor 16. The load or thrust of the ultrasonic head 14 after the replacement can thus be detected with a higher accuracy. The chip mounter 11 thereafter returns to the normal operation. The ultrasonic head 14 after the replacement can in this manner be identified with a higher accuracy in the aforementioned manner.

The chip mounter 11 may employ a piezoelectric sensor such as a quartz pressure gage for the force sensor 16. The working head may include a cutter and the like in addition to the ultrasonic head 14, for example. The present invention may be applied to a cutting machine, for example. A heat source may be incorporated within the ultrasonic head 14.

What is claimed is:

1. An identifying unit for a working machine, comprising:
a force sensor detachably supporting a working head;
a memory holding identification information of various working heads; and
a controller circuit connected to the force sensor and a drive source so as to control the drive source based on load detected at the force sensor for generation of an urging force applied to the working head, said controller circuit designed to identify the working head in a perpendicular direction in relation to a working table based on the load detected at the force sensor and the identification information in the memory.

2. A pressure apparatus comprising:
a movable member;
a force sensor coupled to the movable member;
a contact member detachably connected to the force sensor;
a drive source connected to the movable member for generating a driving force to drive the movable member;
a memory holding identification information of various contact members; and
a controller circuit connected to the force sensor and the drive source so as to control the drive source based on load detected at the force sensor for generation of an urging force applied to the contact member in a perpendicular direction in relation to a working table, said controller circuit designed to identify the contact member based on the load detected at the force sensor and the identification information in the memory.

3. The pressure apparatus according to claim 2, wherein said controller circuit sets a control parameter of the contact member based on identification of the contact member.

4. A working machine comprising:
a work table defining a surface along a horizontal plane;
a working head opposed to the surface of the work table;
a force sensor detachably supporting the working head;
a movable member coupled to the force sensor;
a drive source connected to the movable member for generating a driving force to drive the movable member;
a memory holding identification information of various working heads; and
a controller circuit connected to the force sensor and the drive source so as to control the drive source based on load detected at the force sensor for generation of an urging force applied to the contact member in a perpendicular direction in relation to the working table, said controller circuit designed to identify the working head based on the load detected at the force sensor and the identification information in the memory.

5. The working machine according to claim 4, wherein said controller circuit sets a control parameter of the working head based on identification of the working head.

6. The identifying unit according to claim 1, wherein the force sensor has a central axle detachably coupled to the working head, and the force sensor is designed to detect load acting on the central axle.

7. The identifying unit according to claim 6, wherein the controller circuit is designed to detect a release of a load corresponding to a weight of the working head based on load detected at the force sensor and the controller circuit is designed to identify another working head when the force sensor detects load acting on the central axle after the detection of the release.

* * * * *